(12) United States Patent
Cheng et al.

(10) Patent No.: US 7,078,336 B2
(45) Date of Patent: Jul. 18, 2006

(54) METHOD AND SYSTEM FOR FABRICATING A COPPER BARRIER LAYER WITH LOW DIELECTRIC CONSTANT AND LEAKAGE CURRENT

(75) Inventors: Yi-Lung Cheng, Danshuei (TW); Ying-Lang Wang, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/716,818

(22) Filed: Nov. 19, 2003

(65) Prior Publication Data

US 2005/0106858 A1    May 19, 2005

(51) Int. Cl.
*H01L 21/4763* (2006.01)
(52) U.S. Cl. .................... 438/637; 438/687
(58) Field of Classification Search ........... 438/637, 438/687
See application file for complete search history.

(56) References Cited

U.S. PATENT DOCUMENTS

| | | | |
|---|---|---|---|
| 5,003,062 A | 3/1991 | Yen | |
| 6,165,894 A | 12/2000 | Pramanick et al. | |
| 6,174,810 B1 | 1/2001 | Islam et al. | |
| 6,352,917 B1 | 3/2002 | Gupta et al. | |
| 6,410,426 B1 | 6/2002 | Xing et al. | |
| 6,417,092 B1 | 7/2002 | Jain et al. | |
| 6,444,568 B1 | 9/2002 | Sundararajan et al. | |
| 6,486,283 B1 | 11/2002 | Hong et al. | |
| 6,489,423 B1 | 12/2002 | Jung et al. | |
| 6,489,432 B1 | 12/2002 | Jung et al. | |
| 6,492,441 B1 | 12/2002 | Hong et al. | |
| 6,551,893 B1 * | 4/2003 | Zheng et al. | 438/387 |
| 2002/0016085 A1 * | 2/2002 | Huang et al. | 438/798 |
| 2004/0130035 A1 * | 7/2004 | Wu et al. | 257/774 |
| 2004/0203176 A1 * | 10/2004 | Zhao et al. | 438/3 |

OTHER PUBLICATIONS

Havemann, Robert H. and Hutchby. James A., "High-Performance Interconnects: An Integration Overview," Proceedings of the IEEE, vol. 89, No. 5, May 2001, pp. 586-601.

* cited by examiner

*Primary Examiner*—Richard A. Booth
(74) *Attorney, Agent, or Firm*—Duane Morris LLP

(57) ABSTRACT

A method is disclosed for reducing metal diffusion in a semiconductor device. After forming a first metal portion over a substrate, a silicon carbon nitro-oxide (SiCNO) layer is deposited on the first metal portion. A dielectric layer is deposited over the SiCNO layer, and an opening is generated in the SiCNO layer and the dielectric layer for a second metal portion to be connected to the first metal portion, wherein the SiCNO layer reduces the diffusion of the first metal portion into the dielectric layer.

15 Claims, 4 Drawing Sheets

METHOD AND SYSTEM FOR FABRICATING A COPPER BARRIER LAYER WITH LOW DIELECTRIC CONSTANT AND LEAKAGE CURRENT

BACKGROUND

The present disclosure relates to semiconductor fabrication process, and more particularly to a method and system for fabricating a copper barrier layer with low dielectric constant and leakage current.

Conventional semiconductor devices comprise a semiconductor substrate, normally of monocrystalline silicon, and a plurality of sequentially formed dielectric interlayers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via opening, while a conductive plug filling a contact opening establishes electrical contact with an active region on a semiconductor substrate, such as a source/drain region. Conductive lines formed in trench openings typically extend substantially horizontal with respect to the semiconductor substrate. Semiconductor "chips" comprising five or more levels of metallization are becoming more prevalent as device geometries shrink to submicron levels.

A conductive plug filling a via opening is typically formed by depositing a dielectric interlayer on a conductive layer comprising at least one conductive pattern, forming an opening through the dielectric interlayer by conventional photolithographic and etching techniques, and filling the opening with a conductive material, such as copper (Cu). Excess conductive material on the surface of the dielectric interlayer can be removed by chemical-mechanical polishing (CMP). One such method is known as damascene and basically involves the formation of an opening which is filled in with a metal. Dual damascene techniques involve the formation of an opening comprising a lower contact or via opening section in communication with an upper trench opening section, which opening is filled with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Thus, the interconnection pattern limits the speed of the integrated circuit.

Copper (Cu) and Cu alloys have recently received considerable attention as a replacement material for Al or W in VLSI interconnect metallizations. Cu has a lower resistivity than Al, and has improved electrical properties vis-a-vis W, making Cu a desirable metal for use as a conductive plug as well as conductive wiring. However, Cu does not exhibit high electromigration resistance and readily diffuses through silicon dioxide, the typical dielectric interlayer material, and adversely affects the devices. Due to Cu diffusion through the dielectric interlayer, Cu interconnect structures must be encapsulated by a diffusion barrier layer. Typical diffusion barrier metals include tantalum (Ta), tantalum nitride (TaN), titanium nitride (TiN), titanium tungsten (TiW), or $Si_3N_4$.

The use of such barrier materials to encapsulate Cu is not limited to the interface between Cu and the dielectric interlayer, but includes interfaces with other metals as well.

As such, an improved Cu barrier layer needs to be found so that the dielectric constant and the leakage current characteristics can be improved as well.

SUMMARY

A method is disclosed for reducing metal diffusion in a semiconductor device by using a SiCNO based diffusion barrier layer. After forming a first metal portion over a substrate, a silicon carbon nitro-oxide (SiCNO) layer is deposited on the first metal portion. A dielectric layer is deposited over the SiCNO layer, and an opening is generated in the SiCNO layer and the dielectric layer for a second metal portion to be connected to the first metal portion, wherein the SiCNO layer reduces the diffusion of the first metal portion into the dielectric layer.

These and other aspects and advantages will become apparent from the following detailed description, taken in conjunction with the accompanying drawings, illustrating by way of example the principles of the disclosure.

DESCRIPTION

A method is disclosed for fabricating a copper barrier layer with low dielectric constant and leakage current. The examples shown in the present disclosure provides solutions to the poor electromigration resistance problem of Cu metallization in a cost effective and efficient manner.

In accordance with the examples of the present disclosure, a silicon carbon nitro-oxide (SiCNO) layer is provided that has a low leakage current and is effective in preventing metal atoms from migrating or diffusing through the SiCNO layer. Thus, when compared to conventional silicon carbide (SiC) or silicon carbon nitride (SiCN) layers, the SiCNO layer, while similarly effective in blocking the migration of metal atoms through the layer, also exhibits a lower leakage current. Therefore, the SiCNO layer can be used as a diffusion barrier between a metal layer and a dielectric layer to replace the conventional SiC or SiCN diffusion barrier layer. The SiCNO layer can also be used as an etch stop layer, such as in a dual damascene process, or a sealing or passivation layer for scratch protection.

As employed throughout the disclosure, Cu is intended to encompass elemental Cu as well as any Cu containing materials such as Cu-based alloys exhibiting the electrical properties of Cu including Cu alloys containing minor amounts of silicon and/or Al.

Furthermore, openings formed in accordance with the present disclosure can be implemented by damascene techniques, including dual damascene techniques. The openings formed in the dielectric layer can be via holes which are filled with Cu to form a via interconnecting upper and lower metal lines, or a contact hole in which case the Cu filled hole electrically connects a first metal level line with a source/ drain region in a semiconductor substrate. The opening in the dielectric layer can also be a trench, in which case the filled trench forms an interconnection line. The opening can also be formed by dual damascene techniques, in which case a via/contact communicating with a line is simultaneously formed by Cu deposition.

FIGS. 1A–1E illustrate a process to produce a dual damascene structure 100 in which a diffusion barrier layer (DBL) is desired. A copper (Cu) containing line 102 is first deposited on a substrate 103 using conventional methods. The Cu surface can be improved by removing of any copper oxide that may be remaining on the surface. Typically a hydrogen ($H_2$) or an ammonia ($NH_3$) plasma based reduction is used before the deposition of the DBL. This copper surface reduction to remove CMP residue (e.g., Cu oxide or Cu) can be performed in a PECVD or a HDP chamber. This reduction has the benefit of removing CMP residues from the CMP step and the clean that follows.

Figure 1A:
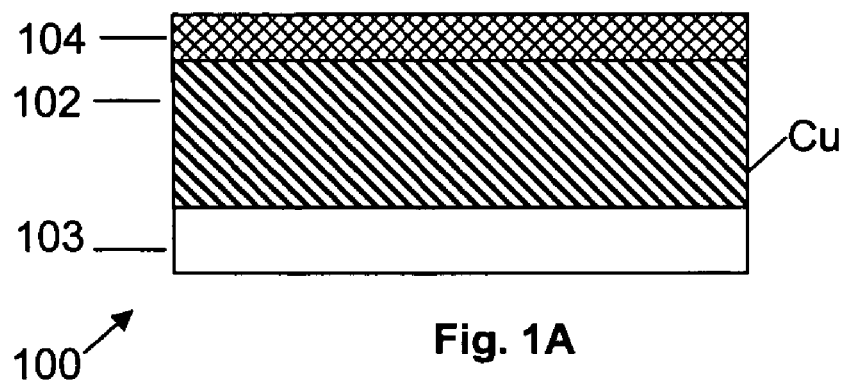
FIGS. 1A–1E schematically illustrate sequential phases of a method in accordance with an example of the present disclosure for fabricating a diffusion barrier layer.
Figure 1B:
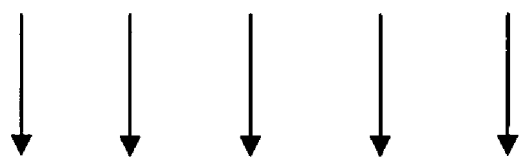
Figure 1B:
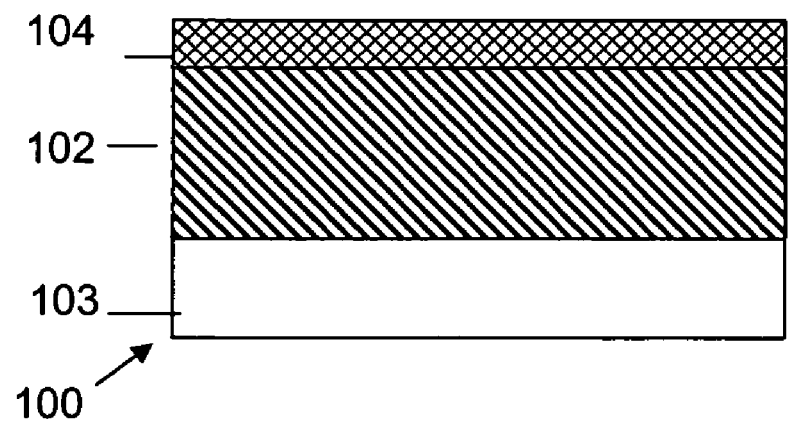

In order to generate the effective DBL, on top of Cu line 102, a Si precursor material 104 to form the DBL is first deposited. In FIG. 1B, the precursor material 104 is then refined by going through oxygen, carbon, and nitride doping to form the eventual product SiCNO as the ultimate DBL 106A in FIG. 1C.

Figure 1C:
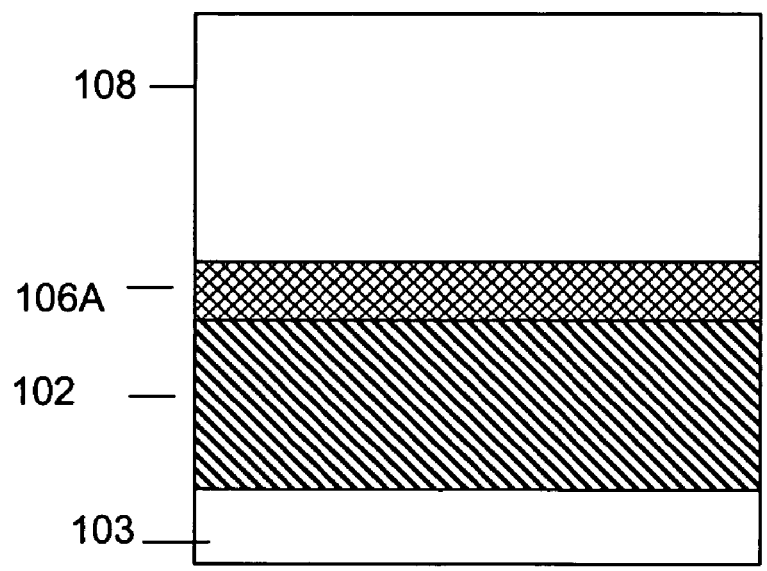
Figure 1D:
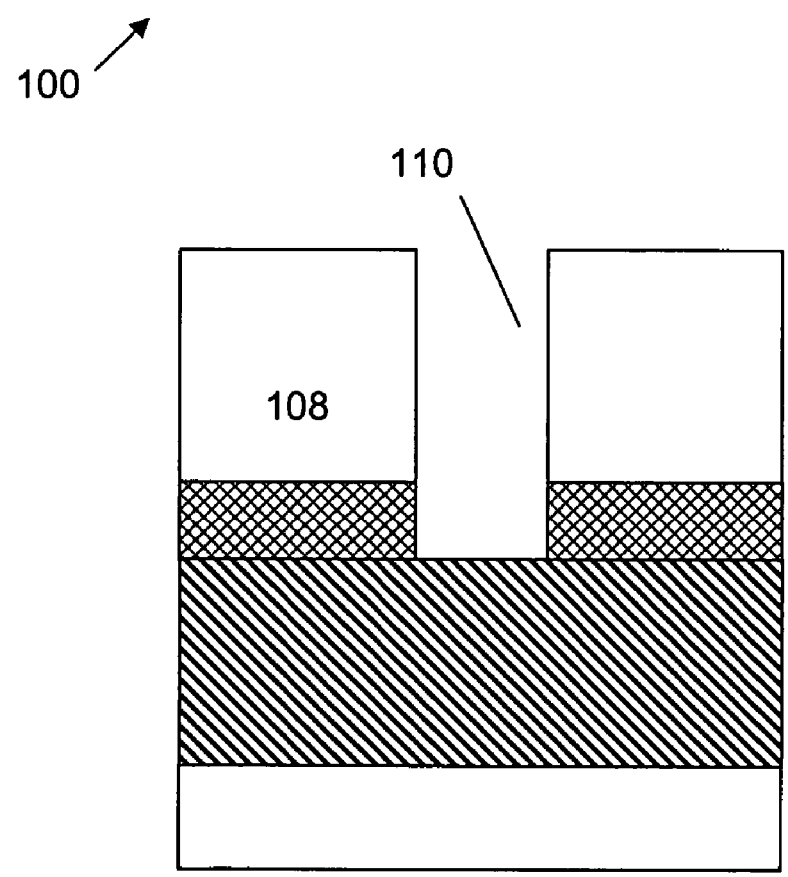
Figure 1E:
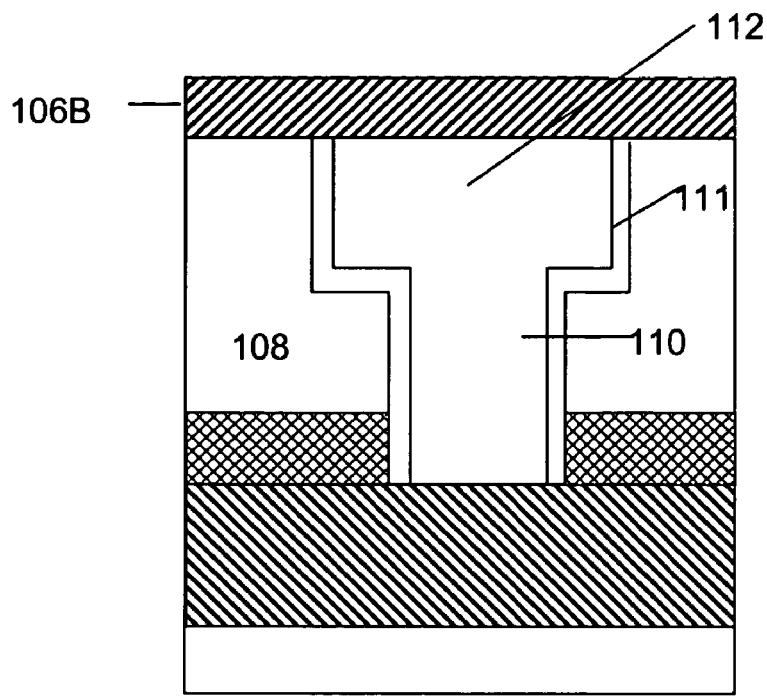

In FIG. 1C, after the deposition of DBL 106A, an inter-level dielectric (ILD) layer 108 is deposited thereon. The thickness of ILD layer 108 is such that both a line and a via can be defined. The ILD layer 108 is etched in a two-step etch so that a via 110 and a line 112 can be fabricated in the "inlaid" dual damascene fashion, as is known to those skilled in the art (as shown in FIGS. 1D and 1E). A "timed" etch can be used to first etch a hole (for the via as shown in FIG. 1D) and then etch a trench (for the line as shown in FIG. 1E) in the ILD layer 108. The via hole etch also etches the underlying portion of the DBL 106A to allow contact with the underlying metal line. A connection metal material can be filled in the via and line as the underlying metal line. The connection metal material can be the same Cu containing material or any other material that makes good adhesion and connection to the underlying Cu containing metal. Another layer of the DBL 106B can be deposited on top of the metal in the via and the ILD layer 108 to seal the metal from diffusion. It is noticed that a sidewall diffusion barrier layer 111 can also be optionally formed on the sidewalls of the via and trench regions. The sidewall diffusion barrier layer 111 can be the same SiCNO based material.

Figure 2:
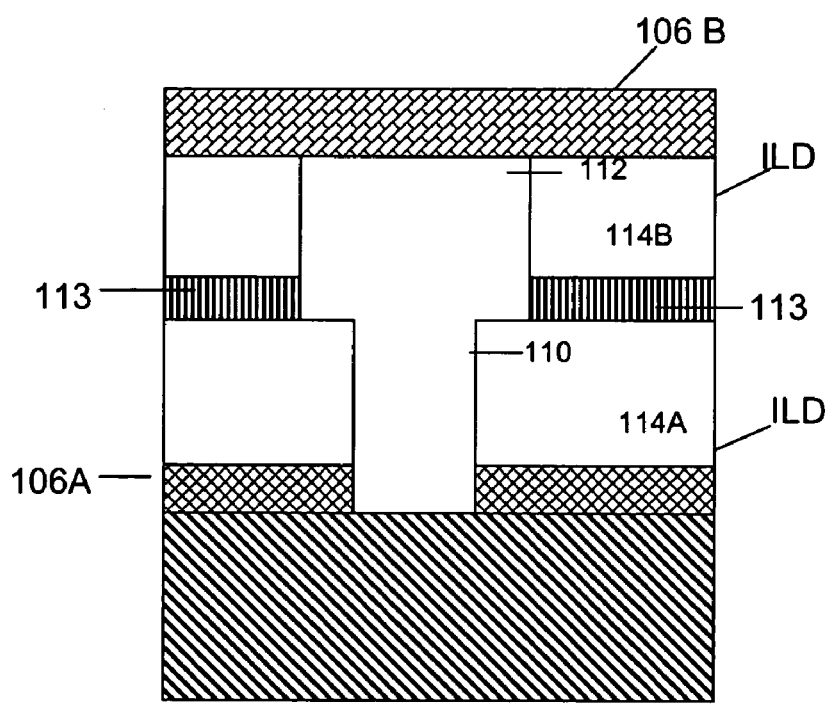
FIG. 2 illustrates sequential phases of a method fabricating a diffusion barrier layer in accordance with another example of the present disclosure.

Alternatively, an "etch stop" layer or DBL 113 can be used for etching the hole and trench, as shown in FIG. 2. A first ILD layer 114A is deposited over the DBL 106A, and the thickness of ILD layer is reduced to a predetermined thickness approximately the height of the via 110. The ILD layer 114A is patterned and etched to create the via hole 110. The portion of the DBL over the via hole is also etched to expose the underlying metal line. The DBL 113 is deposited over the ILD layer 114A, followed by deposition of a second ILD layer 114B, wherein the second ILD layer 114B reaches a predetermined height. The second ILD layer 114B is then patterned and etched to create the trench 112. And, a second DBL 106B can also be deposited to seal the metal in the ILD layers 114A and 114B. The DBL layer 113 is also known as an etch stop layer because it prevents the etching of the second ILD layer 114B from continuing into the first ILD layer 114A. As it may be appreciated by one skilled in the art, the layers 106A, 114A, 113, and 114B can be all stacked up and the etching processes can be conducted from top down in multiple steps to make the via 110 and trench 112. It is noticed that although not shown in FIG. 2, a sidewall diffusion barrier layer like the one in FIG. 1E can also be formed on the sidewalls of the via and trench regions for blocking metal diffusion.

For example, after the etch processes creating the via hole and trench are completed, a metallic (conductive) diffusion barrier deposition (not shown) is created. Over the metallic diffusion barrier layer, a Cu seed layer is deposited, typically about 1500 Å thick. The Cu seed is deposited so as to allow electroplated Cu to fill the trench and the via hole without voids. The next step is the electroplating or the electrofill of the trench and the via hole, as is known to those skilled in the art. Once the Cu fill is completed, a desired line and via are formed in the trench and via hole, respectively. The above described process can then be repeated to form a desired multi-level structure.

The SiCNO layer can be deposited in various ways. The creation of SiCNO can be done by depositing the silicon precursor material by exposing it to oxygen, nitride, and carbon sources. The chemical reaction can be represented as:

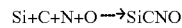

In another example, the SiCNO can be obtained by exposing SiCN to oxygen source such as $CO_2$ or $N_2O$. One suitable method involves deposition in a plasma enhanced chemical vapor deposition (PECVD) chamber. In PECVD, the desired feed gases are reacted by passing them through a plasma field. The plasma used in such processes can comprise energy derived from a variety of sources such as electric discharges, electromagnetic fields in the radio-frequency or microwave range, lasers or particle beams. The specific frequency, power, and pressure are generally adjusted for the application, wafer size, reaction chamber, etc. In addition, those skilled in the art will understand that the rate of film deposition in PECVD processes may increase with the amount of bias power applied to the wafer.

One way of depositing SiCNO using PECVD deposition involves feeding $SiH(CH_3)_3$ or $Si(CH_3)_4$, $CO_2$ or $O_2$, and $NH_3$ to the PECVD chamber. Table 1 below lists the gases for deposition of a SiCNO layer and their respective gas flow ranges, with the actual gas flow amount dependent upon the application and wafer size. The chamber pressure may be kept at 2–4 Torr with a temperature maintained at 325–400° C., and the RF power at 200–400 W.

TABLE 1

| Gas | Flow Rate (sccm) |
| --- | --- |
| He | 100–300 |
| $SiH(CH_3)_3/Si(CH_3)_4$ | 50–150 |
| $NH_3$ | 100–300 |
| $CO_2(O_2)$ | 200–400 |

Instead of using PECVD, the SiCNO layer can also be deposited using high density plasma (HDP) deposition. HDP chemical vapor deposition (CVD) processes typically operate at a pressure range several (two to three) orders of magnitude lower than corresponding PECVD processes (i.e., in the milliTorr range). Moreover, in an HDP reactor, power is coupled inductively, instead of capacitively, to the plasma, resulting in higher plasma density. Consequently, in an HDP reactor, because of the pressure and plasma characteristics, the atoms impinging on the depositing film surface are much more energetic than in a PECVD reactor, such that gas-solid collisions may result in sputtering of the deposited film. Another characteristic of HDP deposition is that increased bias power applied to the wafer results in an increased in situ sputter etch component, thereby decreasing the deposition rate.

Figure 3:
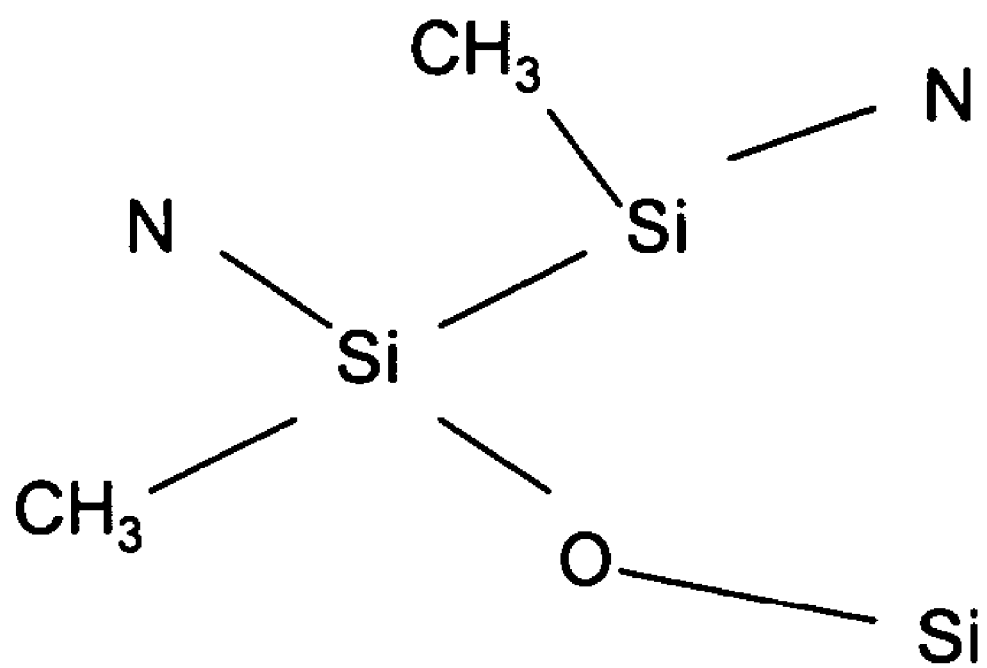
FIG. 3 illustrates an atomic structure of the SiCNO.

FIG. 3 illustrates a chemical cell structure of SiCNO illustrating the bonds connecting Si to O, N, and CH3. Due to the bond between Si and O, a lower leakage current is obtained. Further, a lower breakdown voltage is also achieved. The SiCNO dielectric diffusion barrier layer is critical as it effectively prevents copper diffusion into the ILD layers, while exhibiting low leakage current. For example, SiN may have a breakdown voltage around 7V while the SiCNO has one around 5.9V. The improved barrier layer has a lower dielectric constant around 4.2 while SiN has a higher value of 7.2 and 4.8 for SiC. In addition, the SiCNO barrier layer has a leakage current around 1.02E-9 $A/cm^2$ at 2 MV/cm, which is better than 3.17E-8 $A/cm^2$ of SiCN under the same condition. It is thus suitable for low K process with no additional significant alterations needed for the process. Table 2 below summarizes the features of SiCNO as comparing to other materials.

TABLE 2

|  | SiC | Si3N4 | SiCN | SiCNO |
|---|---|---|---|---|
| Breakdown Voltage (V) | 4.6 | 7 | 5 | 5.9 |
| Dielectric Constant | 4.8 | 7.2 | 5 | 4.2 |
| Leakage Current at 2 mV/cm ($10^{-9} A/cm^2$) | 6.42 | 0.898 | 3.17 | 1.02 |

As a result of using the improved SiCNO layer, and as shown in Table 3 below, the semiconductor fabrication process generates a high density film and high via etch electivity. The SiCNO layer also demonstrate a high resistance against heat and moisture conditions. Another feature of the SiCNO barrier layer is that the adhesion to Cu is better than SiC, and at least is comparable with SiN.

TABLE 3

| Material | Density | Via Dry Etch Rate | Via Dry Etch Rate | Selectivity |
|---|---|---|---|---|
| SiC | 1.7807 | 246 | 492 | 5.23171 |
| SiCNO | 1.825 | 206 | 412 | 6.24767 |

The present disclosure provides cost effective efficient methodology to form reliable Cu metallization with improved electromigration resistance and better adhesion between copper based layers. The present disclosure can be employed in manufacturing various types of semiconductor devices, particularly semiconductor devices having submicron features and high aspect ratio openings.

In the previous description, numerous specific details are set forth, such as specific materials, structures, chemicals, processes, etc, in order to provide a better understanding of the present disclosure. However, the present disclosure can be practiced without resorting to the details specifically set forth. In other instances, well known processing structures have not been described in order not to unnecessarily obscure the present disclosure. It will be understood by those skilled in the art that various changes in form and detail may be made therein without departing from the spirit and scope of the invention, as set forth in the following claims.

What is claimed is:

1. A method for reducing metal diffusion in a semiconductor device, comprising:
   forming a copper containing metal portion over a substrate;
   forming a silicon carbon nitro-oxide (SiCNO) layer on the copper containing metal portion;
   depositing a first dielectric layer over the SiCNO layer; and
   generating an opening in the SiCNO layer and the first dielectric layer for a connection metal portion to be connected to the copper containing metal portion,
   wherein the SiCNO layer reduces the diffusion of the copper containing metal portion into the first dielectric layer.

2. The method of claim 1 wherein the forming a SiCNO layer step is performed in a PECVD chamber.

3. The method of claim 1 wherein the forming a SiCNO layer step includes:
   depositing a Si based precursor layer; and
   exposing the precursor layer to predetermined gases providing C, N, and O elements to form SiCNO.

4. The method of claim 3 wherein the predetermined gases include $SiH(CH_3)_{34}$, $CO_2$ or $O_2$, and $NH_3$.

5. The method of claim 3 wherein the SiCNO is formed under a pressure between 2 and 4 Torr with a temperature between 325 and 400° C.

6. The method of claim 1 wherein the generating step includes:
   etching the first dielectric layer and the SiCNO layer to form a trench region and a via region; and
   depositing the connection metal portion into the trench and via regions.

7. The method of claim 6 further including the step of forming a sealing SiCNO layer on top of the deposited connection metal portion and the first dielectric layer.

8. The method of claim 6 further including the step of forming a sidewall SiCNO layer on the sidewalls of the via and trench before depositing the connection metal portion.

9. The method of claim 1 further comprising:
   reducing the first dielectric layer to a predetermined thickness;
   depositing a SiCNO based etch stop layer on top of the reduced first dielectric layer; and
   depositing a second dielectric layer on top of the etch stop layer.

10. The method of claim 9 wherein the generating step includes:
    etching the first and second dielectric layers and the SiCNO based etch stop layer to form a trench region and a via region; and
    depositing the connection metal portion into the trench and via regions.

11. The method of claim 10 further including the step of forming a sidewall SiCNO layer on the sidewalls of the via and trench before depositing the connection metal portion.

12. The method of claim 9 further comprising depositing on top of the connection metal portion a sealing SiCNO layer that seals the connection metal portion and the second dielectric layer thereunder.

13. A method for reducing copper diffusion in a semiconductor device, comprising:
    depositing a copper containing metal layer on top of a substrate;
    depositing a Si based precursor layer on top of the copper based metal layer;

exposing the precursor layer to predetermined gases to form a silicon carbon nitro-oxide (SiCNO) layer;

depositing a first dielectric layer on top of the SiCNO layer;

reducing the first dielectric layer to a predetermined thickness;

depositing a SiCNO based etch stop layer on top of the reduced first dielectric layer;

depositing a second dielectric layer on top of the etch stop layer;

etching the first and second dielectric layers and the SiCNO based etch stop layer to form a trench region and a via region;

depositing a predetermined metal into the trench and via regions to contact the copper based metal layer;

wherein the SiCNO layer prevents the diffusion of the copper based metal layer into the first dielectric layer.

14. The method of claim 13 further comprising depositing on top of the trench a sealing SiCNO layer that seals the trench and second dielectric layer thereunder.

15. The method of claim 13 further comprising forming a sidewall SiCNO layer covering the sidewalls of the trench and via regions.

* * * * *